United States Patent
Kamada (10) Patent No.: US 8,759,855 B2
(45) Date of Patent: Jun. 24, 2014

(54) LIGHT EMITTING DEVICE INCLUDING SUPPORT MEMBER AND BONDING MEMBER

(75) Inventor: Kazuhiro Kamada, Tokushima (JP)

(73) Assignee: Nichia Corporation, Anan-shi (JP)

( * ) Notice: Subject to any disclaimer, the term of this patent is extended or adjusted under 35 U.S.C. 154(b) by 213 days.

(21) Appl. No.: 13/229,524

(22) Filed: Sep. 9, 2011

(65) Prior Publication Data

US 2012/0061706 A1  Mar. 15, 2012

(30) Foreign Application Priority Data

Sep. 10, 2010  (JP) ................... 2010-203303
Aug. 22, 2011  (JP) ................... 2011-180079

(51) Int. Cl.
*H01L 33/00*  (2010.01)

(52) U.S. Cl.
USPC ............. 257/98; 257/E33.066; 257/E33.067; 438/27

(58) Field of Classification Search
USPC ................ 257/98, E33.066, E33.097; 438/27
See application file for complete search history.

(56) References Cited

U.S. PATENT DOCUMENTS

| 7,242,033 B2 * | 7/2007 | Isokawa et al. ................. 257/99 |
| 8,444,882 B2 * | 5/2013 | Kanisawa et al. ............. 252/514 |
| 8,481,370 B2 * | 7/2013 | Nishi et al. .................... 438/119 |
| 2004/0036079 A1 | 2/2004 | Nakada et al. |

FOREIGN PATENT DOCUMENTS

| JP | 2005-191135 | 7/2005 |
| JP | 2005-244147 | 9/2005 |
| JP | 2005-340472 | 12/2005 |
| JP | 2006-093626 | 4/2006 |

* cited by examiner

*Primary Examiner* — Stephen W Smoot
*Assistant Examiner* — Vicki B Booker
(74) *Attorney, Agent, or Firm* — Foley & Lardner LLP

(57) ABSTRACT

A light emitting device includes a support member having a mounting surface. The support member includes an insulating member having top surface and a plurality of side surfaces, a first metal pattern disposed on the top surface of the insulating member, and a second metal pattern disposed on the side surface of the insulating member such that a side surface of the second metal pattern is continuous with a top surface of the first metal pattern. The light emitting device further includes a light emitting element mounted on the mounting surface at a location of the first metal pattern, and a bonding member that bonds the light emitting element to the mounting surface. The bonding member covers at least a portion of the first metal pattern and at least a portion of the second metal pattern.

20 Claims, 9 Drawing Sheets

LIGHT EMITTING DEVICE INCLUDING SUPPORT MEMBER AND BONDING MEMBER

CROSS-REFERENCE TO RELATED PATENT APPLICATIONS

This application claims priority under 35 U.S.C. §119 to Japanese Patent Applications No. 2010-203303, filed on Sep. 10, 2010, and No. 2011-180079, filed on Aug. 22, 2011, the disclosures of which are incorporated herein by reference.

BACKGROUND OF THE INVENTION

1. Field of the Invention

The present invention relates generally to the field of light emitting devices. The present invention relates to a light emitting device that can be used, for example, as an indicator, a lighting apparatus, a display, or a backlight light source for liquid crystal display.

2. Description of Related Art

In recent years, various semiconductor devices have been proposed and put into practical use. Yet the demand for high performance is ever increasing. In particular, there is an increasing need for electrical components that can maintain performance for long periods of time even in severe environments. The same applies for light emitting diodes (LEDs) and other light emitting devices. Requirements for higher performance in the area of general lighting, in-vehicle lighting, and the like, is growing daily. Demand has increased for devices that can yield higher output (higher luminance) and higher reliability, while having a low cost.

Generally, a light emitting device includes a base member on which electric components such as a semiconductor light emitting element (hereinafter referred to as a light emitting element) and a protective element are mounted, and a conductive member for supplying electric power to these electric components. The light emitting device may further include a sealing member to protect the electric components from the external environment.

In such light emitting devices, various kinds of bonding members may be employed to mount the light emitting element on the base member. The bonding member may be made of a thermosetting resins such as an epoxy resin and a polyimide resin. The thermosetting resin may contain a filler such as Ag or silica. Furthermore, in order to meet the recent demands of higher output of the light emitting devices, Au—Sn and Sn—Ag—Cu based solder materials or materials made of a metal such as silver solder may be used to improve the heat dissipation properties and reliability of the devices, as described, for example, in JP 2005-191135A.

However, such bonding members described above which are employed in the light emitting devices have lower light reflectivity and higher optical absorptance compared to the materials which are typically used in a reflective member. Therefore, in the light emitting devices having a conventional structure, light is absorbed by the bonding member located near the light emitting element, which can causes problems due to insufficient light being provided by the light emitting device.

For example, a bonding member containing a resin may be deteriorated and/or discolored by light and heat generated from the light emitting element, which may result in an increase in the optical absorptance.

Even when a bonding member made of a metal which does not deteriorate is employed, the light reflectivity of the metal materials typically used in the bonding member is lower than that of the materials typically used in a reflective member.

Further, when a large amount of the bonding member applied to obtain reliable bonding spreads to the surroundings of the light emitting element, the optical loss is particularly large.

As described above, in the light emitting devices having a conventional structure, light may be absorbed by the bonding member located near the light emitting element, which causes a problem in which sufficient light can not be extracted.

SUMMARY OF THE INVENTION

According to one embodiment, a light emitting device includes a support member having a mounting surface. The support member includes an insulating member having top surface and a plurality of side surfaces, a first metal pattern disposed on the top surface of the insulating member, and a second metal pattern disposed on the side surface of the insulating member such that a side surface of the second metal pattern is continuous with a top surface of the first metal pattern. The light emitting device further includes a light emitting element mounted on the mounting surface at a location of the first metal pattern, and a bonding member that bonds the light emitting element to the mounting surface. The bonding member covers at least a portion of the first metal pattern and at least a portion of the second metal pattern.

According to another embodiment, a method of manufacturing a light emitting device includes providing a support member having a mounting surface. The support member includes an insulating member having top surface and a plurality of side surfaces, a first metal pattern disposed on the top surface of the insulating member, and a second metal pattern disposed on the side surface of the insulating member such that a side surface of the second metal pattern is continuous with a top surface of the first metal pattern. The method further includes providing a light emitting element, depositing a bonding member onto one or more of: (i) the mounting surface and (ii) the light emitting element, and mounting the light emitting to the support substrate at a location of the first metal pattern such that the bonding member bonds the light emitting element to the mounting surface and the bonding member covers at least a portion of the first metal pattern and at least a portion of the second metal pattern.

DETAILED DESCRIPTION

The supporting members and light emitting devices according to embodiments of the present invention are explained below with reference to the accompanying drawings, in which the sizes of or positional relationships between some parts of the semiconductor light emitting elements may be exaggerated for clarification. In addition, in the following explanations, identical or equivalent elements or constituents may be indicated by the same denotations or similar reference numbers through the embodiments, and descriptions of the identical or equivalent elements or constituents are not repeated through the explanations of the embodiments unless necessary.

First Embodiment

Figure 1:
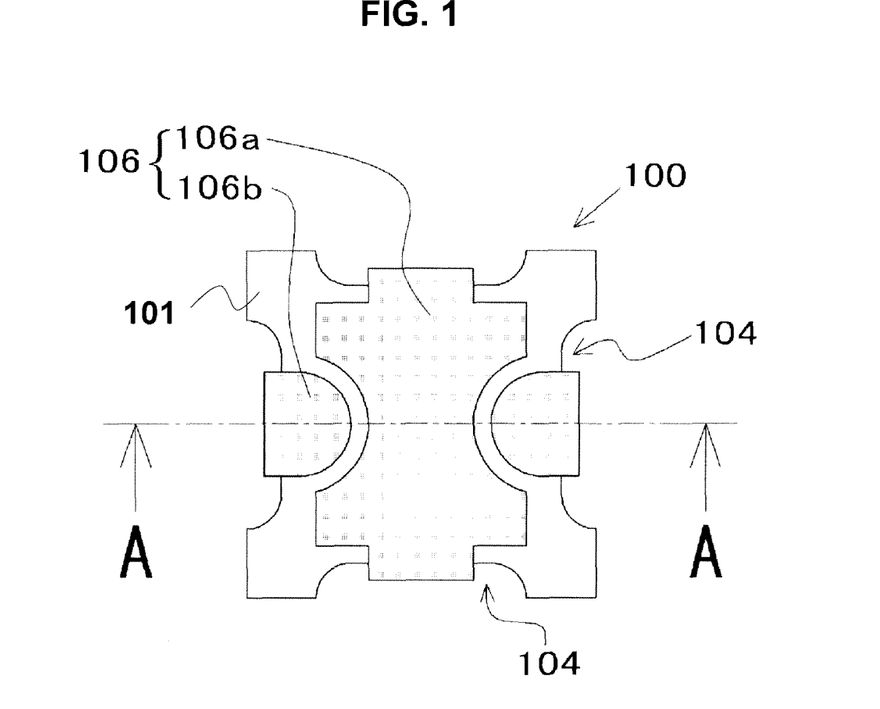
FIG. 1 is a top view depicting a supporting member according to an embodiment of the present invention.
Figure 2:
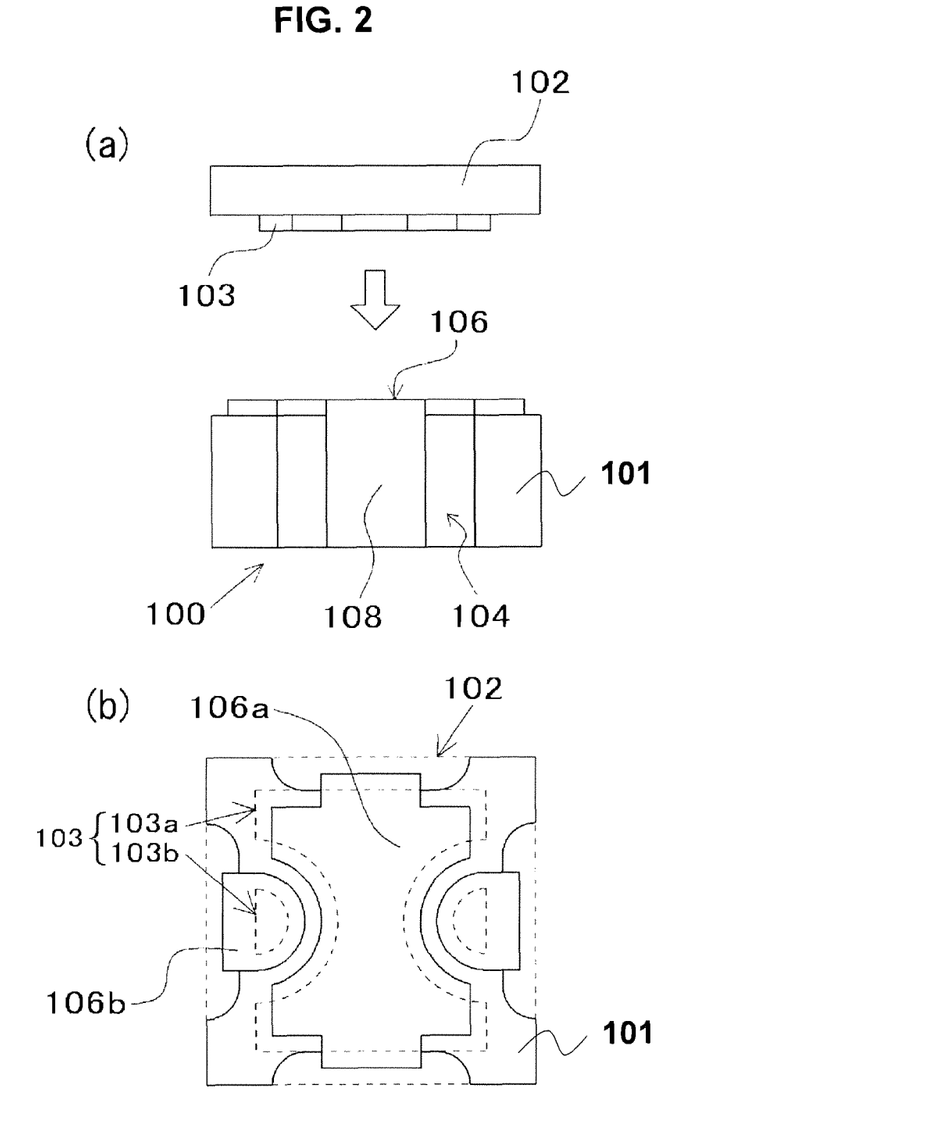
FIG. 2(a) is a front view depicting the supporting member of FIG. 1 and a light emitting element to be mounted on the supporting member.
FIG. 2(b) is a top view depicting the supporting member and light emitting element of FIG. 2(a) with the light emitting element mounted on the supporting member.
Figure 3:
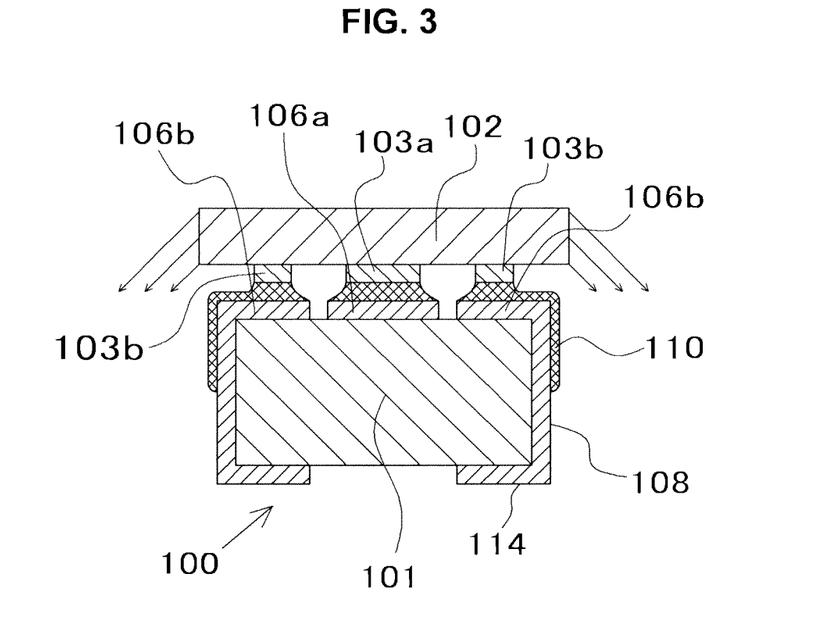
FIG. 3 is a front cross-sectional view depicting the supporting member and light emitting element of FIG. 2(a) along the cross-section A-A, as indicated in FIG. 1.

A supporting member 100 according to a first embodiment is shown in FIG. 1 to FIG. 3. FIG. 1 is a top view depicting a supporting member 100 according to the first embodiment of the present invention. The supporting member 100 is a member on which a light emitting element may be mounted. FIG. 1 depicts a supporting member 100 before a light emitting element has been mounted. The supporting member 100 includes an insulating member 101 having a top surface and side surfaces. A first metal pattern 106 is disposed on the planar top surface of the insulating member 101.

FIG. 2(a) is a front view of the supporting member 100 of FIG. 1, illustrating the light emitting element 102 being mounted on the supporting member 100.

FIG. 2(b) is a top view depicting the light emitting element 102 mounted on the supporting member 100. The supporting member 100 is shown through the light emitting element 102. The light emitting element 102 includes electrodes 103. A first electrode 103a may, for example, be a positive electrode, while a second electrode 103b may, for example, be a negative electrode. The contour of the light emitting element 102 and the pattern of the electrodes 103 are shown in dotted lines in FIG. 2(b). The portions shown in light shading are the contact portions between the first metal pattern 106 (106a and 106b) of the supporting member 100 and the electrodes 103 of the light emitting element 102.

FIG. 3 is a front cross-sectional view depicting the supporting member 100 and light emitting element 102 of FIG. 2(a) along the cross-section A-A, as indicated in FIG. 1. The arrows in FIG. 3 indicate light emitted downward from the light emitting element.

In the embodiment shown in FIGS. 1-3, the supporting member 100 may have an approximately cuboid shape (though sides of the insulating member 101 may have concave cut-out sections, as discussed below). The mounting surface for the light emitting element 102 may have an approximately square shape.

The planar shape of the light emitting element 102 may approximately correspond to the shape of the mounting surface of the supporting member 100.

The mounting surface of the supporting member 100 may include the first metal pattern 106 for connecting the light emitting element 102 with the respective electrodes 103.

The center portion of each side of the insulating member 101 may have a concave cut-out section 104. The cut-out section 104 may be formed as a half ovular through-hole that extends from the upper surface to the lower surface of the insulating member 101. Thus, each cut-out section 104 may have a flat center portion and curved side portions, as depicted in FIG. 1.

The first metal pattern 106 includes one or more first terminals 106a and second terminals 106b. In FIG. 1, for example, the first metal pattern includes one first terminal 106a and two second terminals 106b. The first terminal 106a may, for example, be a positive terminal, while the second terminal 106b may, for example, be a negative terminal. The first terminal 106a may be formed in approximately the center of the mounting surface of the supporting member 100. The first terminal 106a may have a protrusion at each of a pair of opposite sides of the first terminal 106a (depicted at the top and bottom of the first terminal 106a in FIG. 1). The protrusion may be in contact with and/or integral with a second metal pattern 108 disposed on a cut-out section 104 of each of a pair of corresponding opposing side surfaces of the insulating member 101, as shown, for example, in FIG. 2(a). Thus, the side surface of the second metal pattern 108 may be continuous with the top surface of the first terminal 106a of the first metal pattern 106.

The first terminal may one or more concave portions. The concave portions may be on opposing sides of the first terminal. The second terminal 106b may be disposed on the mounting surface such that a portion of the second terminals 106b interposes a concave portion of the first terminal 106a. The second terminals 106b may have a semicircular shape.

As shown in FIG. 2(b), the first terminal 106a may have a portion that is smaller in width than the corresponding portion of the first electrode 103a. The width of the first terminal 106a between the concave portions may be larger than the width of the corresponding portion of the first electrode 103a. The second terminal 106b may have a cross-sectional area that is larger than the corresponding second electrode 103b. The shapes of the first and second terminals 106a and 106b may be adopted according to the shapes of the electrodes 103 of the light emitting elements 102 at the positions at which the electrodes 103 are connected.

The second metal pattern 108 may be disposed on each of a pair of side surfaces of the insulating member 101. The second metal pattern 108 may be disposed on each side surface of the insulating member 101. The second metal pattern 108 may be formed such that side surfaces of the second metal pattern 108 are continuous with top surfaces of the first terminals 106a and/or the second terminals 106b. The second metal pattern 108 may be disposed from the upper surface of the insulating member 101 to the lower surface of the insulating member 101, such that the second metal pattern covers part of the flat center portion of the cut-out section 104.

The light emitting element 102 is bonded to the first metal pattern 106 through a bonding member 110, as shown in FIG. 3. The bonding member 110 is applied such that it covers at least a part of the second metal pattern 108. That is, because the first metal pattern 106 and the second metal pattern 108 are continuous with each other, when the bonding member material squeezed out from between the first metal pattern 106 and the electrodes 103 during bonding, an excess amount of the material will spread to the second metal pattern 108. The configuration of the metal patterns 106 and 108 allows the excess bonding member material to be directed to a surface other than the light emitting element mounting surface. It is thereby possible to avoid light emitted from the light emitting element 102 from being absorbed by bonding member material that is squeezed out onto the mounting surface. Unabsorbed light emitted downwardly may be extracted from the upper surface by being reflected by a light-reflecting member provided on a member for mounting the supporting member 100, or may be extracted directly from the lower surface.

The metal patterns 106 and 108 have a higher wettability than the insulating member 101. Therefore, due to the configuration of the metal patterns 106 and 108, the bonding member may spread to the surfaces of the metal patterns 106 and 108 rather than the surface of the insulating member 101. When the metal patterns 106 and 108 are not formed to extend out from directly under the light emitting element 102, there is no way to direct the direct the excess material from the bonding member. Thus, unevenness in the amount of applied bonding member material may affect the thickness of the bonding member, cause a tilt in the mounted light emitting element 102, and cause a positional deviation in the mounting position. For at least these reasons, it is desirable to provide the metal patterns 106 and 108, by which the bonding member material can spread outward from directly under the light emitting element.

Furthermore, when the light emitting element 102 and the supporting member 100 are bonded only at the portion directly under the light emitting element 102, the condition of the bonding member 110 cannot be observed from the outside. When the bonding member material is squeezed outward from beneath the light emitting element using the metal patterns 106 and 108, the condition of the bonding member can be easily determined by viewing the amount of bonding member material that has been squeezed onto the metal patterns 106 and 108. The ability of the bonding member material to spread outward from beneath the light emitting element 102 via the metal patterns 106 and 108 is valuable in terms of ease of manufacturing.

The configuration of the metal patterns 106 and 108, having a higher wettability than the insulating member 101, prevents the bonding member material from spreading to locations on which the light emitted from the light emitting element 102 is directly incident. Thus, light emitting devices that include the supporting member 100 have highly efficient light extraction properties, and have fewer problems related to the tilting and positional deviation of the light emitting element 102.

Supporting Member

The supporting member 100 is a member for mounting the light emitting element 102. The supporting member is sometimes called a "package substrate" or "submount." The supporting member may have various shapes, such as a cuboid, a cube, a column, or a prism. As explained above, the first metal pattern 106 is disposed on the upper surface of the insulating member 101 such that it is a part of the upper surface of the supporting member 101, and the second metal pattern 108 is disposed on the side surfaces of the insulating member 101 such that it is a part of the side surfaces of the supporting member 100.

Examples of materials that can be used for the insulating member 101 of the supporting member 100 include a glass epoxy, a resin, and ceramics. It is preferable that the insulating member 101 be made from ceramic materials such as alumina, aluminum nitride, and mullite, which allow easy formation of the metal patterns 106 and 108 on its surface while having good heat resistance and weather resistance properties. An insulating member 101 made of ceramics may be provided with an insulating layer made of insulating materials other than ceramics. Examples of such insulating material include a BT resin, a glass epoxy, and an epoxy-based resin. In order to suitably dissipate heat generated from the light emitting elements 102, the materials of the insulating member 101 preferably have a thermal conductivity of 150 W/m·K or higher. The insulating member 101 may alternatively be made of a metal member having insulating portions.

It is preferable that either the side surface on which the second metal pattern 108 is disposed is substantially coplanar with a corresponding side surface of the light emitting element 102, or that the side surface of the light emitting element 102 extends beyond the side surface on which the second metal pattern 108 is disposed. In this way, the portion of the bonding member 110 that is squeezed from between the first metal pattern 106 and the electrodes 103 is not located in areas where light from the light emitting element 101 tends to be absorbed. In this specification, the term "substantially coplanar" means within 500 μm of planar. When discussing planarity for embodiments in which the supporting member 100 comprises a cut-out section 104 in the side surface of the insulating member 101, the term "side surface" refers to the section of the side surface without the cut-out section 104.

It is preferable that that a cut-out section 104 is located in a side surface of the insulating member 101 and that the second metal pattern 108 is disposed in the cut-out section 104. In the embodiment shown in FIG. 3, for example, the side surface of the light emitting element 102 extends beyond the side surface of the second metal pattern 108. The second metal pattern does not necessarily cover the entire cut-out section 104.

Cut-out Section

The cut-out section 104 in a side surface of the supporting member 100 is formed by cutting out a portion of the a side surface of the insulating member 101. Disposing the second metal pattern 108 on a portion of the cut-out section 104 allows the bonding member 110 to be arranged within the cut-out section 104. As shown in FIG. 2(a), the cut-out section 104 may extend from the upper surface to the lower surface of the insulating member 101. The second metal pattern 108 can be disposed such that it extends to the lower surface of the insulating member 101, such that electric contact can easily be established from the lower surface of the supporting member 100. The cut-out section 104 may have any shape and need not extend from the upper surface of the insulating member 101 to the lower surface of the insulating member 101, as long as the first and second metal patterns 106 and 108 can be disposed such that the excess bonding member material can be directed outward toward the side surface of the supporting member 100.

As shown in FIG. 1, it is preferable that at least two opposing sides of the insulating member 101 (and more preferably, all the side surfaces of the insulating member 101) have a cut-out section 104. This is because the use of cut-out sections reduces the amount bonding member material that is located near the light emitting element 102.

Light Emitting Element

The light emitting element 102 to be mounted on the supporting member 100 is not specifically limited and any known light emitting elements can be used, but a light emitting diode is preferably used as the light emitting element 102. A light emitting element of any appropriate wavelength can be employed. For example, for a light emitting element capable of emitting blue or green light, a light emitting element using ZnSe, a nitride-based semiconductor ($In_xAl_yGa_{1-X-Y}N$, $0 \leq X$, $0 \leq Y$, $X+Y \leq 1$), or GaP may be employed. For a light emitting element capable of emitting red light, GaAlAs, AlInGaP, or the like may be employed. A semiconductor light emitting element made of a material other than the above may also be employed. The composition, color of emitted light, size, and number of the light emitting elements to be employed can be selected appropriately according to their purpose. If a light emitting device having a fluorescent material is used, it is suitable to employ a nitride semiconductor ($In_xAl_yGa_{1-X-Y}N$, $0 \leq X$, $0 \leq Y$, $X+Y \leq 1$) capable of emitting light of a short wavelength that can efficiently excite the fluorescent material. The emission wavelength can be varied by the materials and the content ratio of the mixed crystal of the semiconductor layer. The positive and negative electrodes may be disposed on the same surface or the positive and negative electrodes may be disposed on different surfaces.

The light emitting element 102 of the present embodiment has a pair of positive and negative electrodes on the same surface. The pair of electrodes are mounted in flip-chip manner (such that the electrodes face the upper surface of the supporting member 100) on the respective metal patterns 106 of the supporting member 100 through the conductive member 110, and the surface opposite from the surface where the electrodes are mounted is arranged as the light extracting surface. The light emitting element 102 may be formed by stacking layers of nitride semiconductors on a light transmissive sapphire growth substrate, in which the sapphire substrate is arranged at the upper surface side of the light emitting element 102 so as to be the light extracting surface. The sapphire substrate may have unevenness in the bonding surface with the nitride semiconductor layer, and accordingly, the critical angle of the light emitted from the nitride semiconductor layer incident on the sapphire substrate can be altered intentionally, which facilitates extraction of light out of the sapphire substrate. The growth substrate may be removed, by using, for example, LLO (Laser Lift Off) or the like. Such growth substrate is not limited to a sapphire substrate and can be appropriately changed.

In the present embodiment, as shown in FIG. 2(b) and the schematic cross-sectional view in FIG. 3, a pair of negative electrodes 103b may be formed interposing the positive electrode 103a, and each of the electrodes may be connected to the first metal patterns 106a, 106b through the bonding member 110. Each of the first terminals 106a to which the positive electrode 103a of the light emitting element 102 is connected and the second terminals 106b to which the negative electrode 103b of the light emitting element 102 is connected may be provided with a second metal pattern 108 which is disposed on a side surface of the insulating member 101. The second metal pattern 108 may be formed such that side surfaces of the second metal pattern 108 are continuous with top surfaces of the first terminals 106a and/or the second terminals 106b, such that the bonding member 110 may be wet spread on the second metal patter 108. In the present embodiment, each of the electrodes of the light emitting element 102 is directly bonded by using the conductive bonding member 110, so that the first metal pattern 106 and the second metal pattern 108 also serve as the conductive wiring for supplying electric current to the light emitting element 102.

First Metal Pattern and Second Metal Pattern

The first metal pattern 106 may disposed on the upper surface of the insulating member 101. The first metal pattern 106 may be disposed at portions adjacent to respective side surfaces so as to connect to the second metal pattern 108 disposed on the side surfaces of the insulating member 101. The shape of the first metal pattern 106 can be appropriately changed according to the shape of the electrodes 103 of the light emitting element 102 to be mounted.

The materials of the first metal pattern 106 and the second metal pattern 108 can be appropriately selected depending on the material of the insulating member 101 and the method of manufacturing. For example, when a ceramic is used as the material of the insulating member 101, the materials of the first metal pattern 106 and the second metal pattern 108 preferably have a high melting point so as to be able to endure the firing temperature of the ceramic sheet. A metal having a high melting point such as tungsten and molybdenum is preferable. A different metal material may be applied to coat the upper surface of the first metal pattern 106 and second metal pattern 108 by way of plating or the like.

When a glass epoxy resin or the like is used for the material of the insulating member 101, the first metal pattern 106 and the second metal pattern 108 are preferably made of a material that is easy to process. When an injection-molded epoxy resin is used as the material of the insulating member 101, the first metal pattern 106 and the second metal pattern 108 are preferably made of a material that has a relatively high mechanical strength and is easy to process by way of punching, etching, bending, or the like. Examples of such materials include a metal such as copper, aluminum, gold, silver, tungsten, iron, and nickel or iron-nickel alloy, phosphor bronze, copper-iron alloy and molybdenum.

The surface of the metal patterns may further be covered with a metal material, which is not specifically limited. Examples of such metal materials include silver, or an alloy of silver and a metal having high reflectance such as copper, gold, aluminum, or rhodium, or a multilayer film using silver and such alloys. The metal material may be disposed by way of plating or other techniques such as sputtering or vapor deposition.

Bonding Member

The bonding member 110 is a member for bonding the electrodes 103 of the light emitting element 102 and respective first metal patterns 106. Examples of appropriate bonding member materials include an Au alloy, an Ag alloy, a Pd alloy, an In alloy, a Pb—Pd alloy, an Au—Ga alloy, an Au—Sn alloy, a Sn alloy, an Au—Ge alloy, an Au—Si alloy, an Al alloy, and/or a Cu—In alloy. The bonding member material may be a mixture of a metal and a flux. For some embodiments, the bonding member need not be conductive. Rather, an insulating resin (resin composition) such as an epoxy resin or a silicone resin can be used.

When the light emitting element 102 is mounted in flip-chip manner, a conductive member may be used for the bonding member 110 to electrically connect the electrodes 103 of the light emitting element 102 and the respective first metal pattern 106. When electric connection is not needed, for example, when bonding the insulating substrate side of the light emitting element, an insulating resin or the like may be used. The bonding member 110 described above may be disposed as a single member or as a combination of several different members. When a light transmissive bonding member is used, a fluorescent member capable of absorbing the light from the semiconductor light emitting element and emitting light of different wavelength can be contained in the bonding member.

Bonding of the Light Emitting Element

An example of a method of bonding the light emitting element 102 and the first metal pattern 106 will be illustrated below.

In one embodiment, shown in FIG. 2(a), the electrodes of the light emitting element 102 are placed opposite the first metal pattern 106 and bonded through a bonding member 110 (not shown in FIG. 2(a)). The amount of bonding member material is such that the bonding member material is squeezed out from the bottom surface of the light emitting element 102 and extends to the second metal pattern 108.

For example, when a Au—Sn paste is used as the bonding member, the bonding member made of the Au—Sn paste may be applied on the first metal pattern 106 of the supporting member 100 and the light emitting element 102 may disposed on the Au—Sn paste. Alternatively, a metal bonding member material may be applied beforehand on the electrodes 103 of the light emitting element 102 and then the light emitting element 102 may be disposed on the first metal pattern 106. Thereafter, heat may be applied to melt the metal bonding member. When there is a difference in wettability in the insulating member 101 and the first metal pattern 106, such as when the insulating material is a ceramic, the metal bonding member material is repelled at the ceramic portion and wet spreads along the first metal pattern 106. Even when bonding member material is covers portions of both the first metal pattern 106 and the insulating member 101, the hot-melted bonding member tends to spread along the first metal patter 106 due to the difference in wettability. Furthermore, due to the configuration of the first metal pattern 106 and second metal pattern 108, the melted bonding member material wet spreads to the second metal pattern 108 disposed continuous to the respective first metal patterns 106.

Covering the first metal pattern 106 and the second metal pattern 108 as described above enables improvement in the bonding strength of the light emitting element 102 and the supporting member 100, and reduces unevenness in the thickness of the bonding member 110. Also, directing the squeezed-out portion of the bonding member to the second metal patterns 108 located on the respective side surfaces of the insulating member 101 as described above allows a configuration where the light from the light emitting element is not incident on the squeezed-out portion of the bonding member 110, and thus reduces absorption of light incident on the squeezed-out portion of the bonding member 110.

The bonding member 110 may cover only a part of the second metal patter 108, and need not cover the entire second metal pattern 108.

Third Metal Pattern

Further, the supporting member 100 according to the present embodiment may include a third metal pattern 114 on the lower surface of the insulating member 101, as shown in FIG. 3. The bottom surface of the third metal pattern 114 may be continuous with the side surface of the second metal pattern. Disposing a third metal pattern 114 on the lower surface of the insulating member 101 allows further mounting of the supporting member 100 on another substrate or the like with easy establishment of electrical connection.

Second Embodiment

Figure 4:
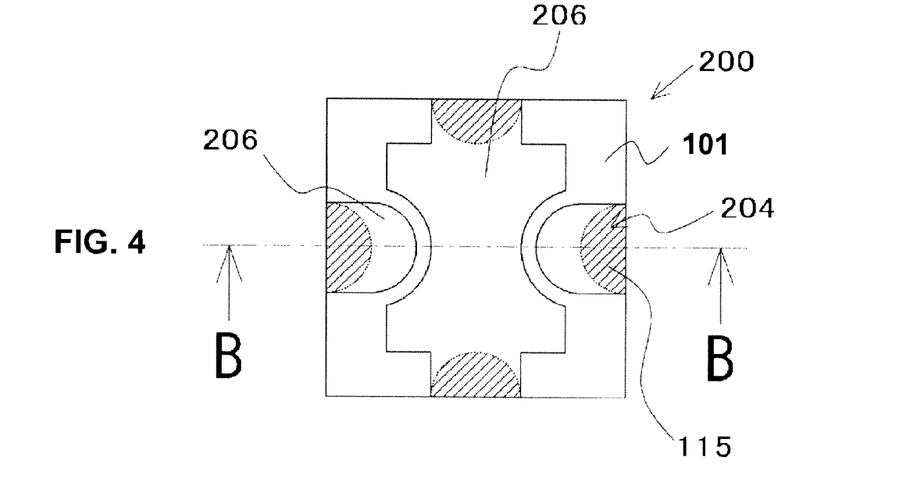
FIG. 4 is a top view depicting a supporting member according to another embodiment of the present invention.
Figure 5:
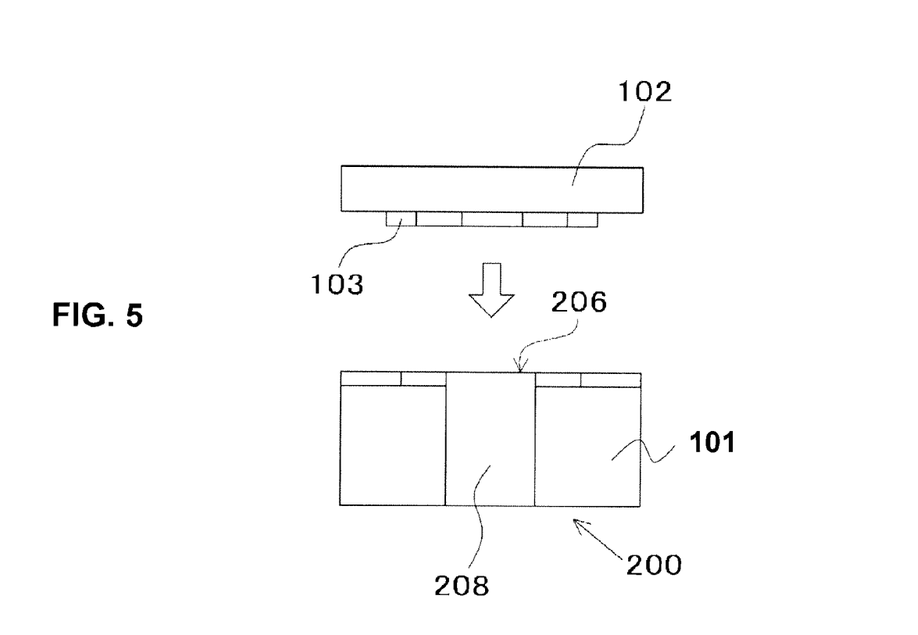
FIG. 5 is a front view depicting the supporting member of FIG. 4 and a light emitting element to be mounted on the supporting member.
Figure 6:
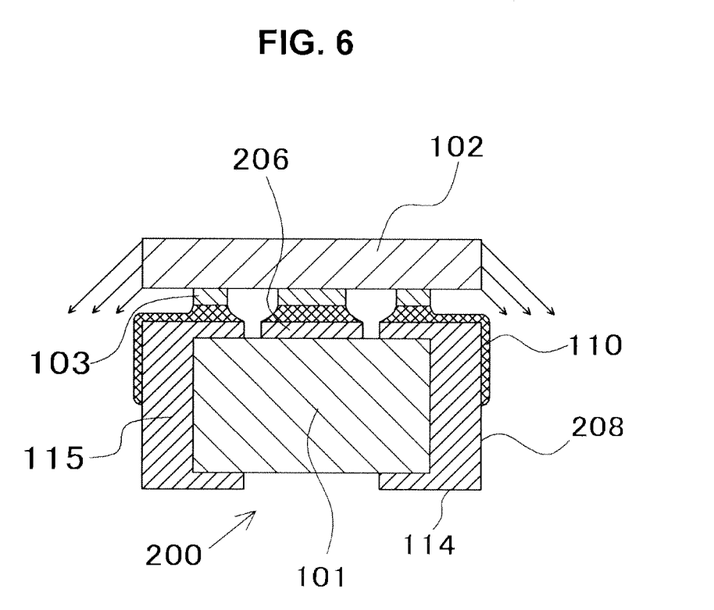
FIG. 6 is a front cross-sectional view depicting the supporting member and light emitting element of FIG. 5 along the cross-section B-B, as indicated in FIG. 4.

A supporting member 200 according to a second embodiment is shown in FIG. 4 to FIG. 6. FIG. 4 is a top view depicting a supporting member 200 according to the second embodiment of the present invention.

FIG. 5 is a front view of the supporting member 200 of FIG. 4, illustrating the light emitting element 102 being mounted on the supporting member 200.

FIG. 6 is a front cross-sectional view depicting the supporting member 200 and light emitting element 102 of FIG. 4 along the cross-section B-B.

In the present embodiment, the center portion of each side of the insulating member 101 may have one or more concave cut-out sections 204. Each cut-out section 204 may have a semicircular column shape penetrating from the upper surface to the bottom surface of the insulating member 101. A metal member 115 may be embedded in each of the cut-out sections 204. The side surface of the metal member may be coplanar with the side surface of the insulating member 101 such that side surfaces of the supporting member 200 are flat.

In FIG. 4, first conductive patterns 206 are shown in light shading. The portions at which the metal member 115 are embedded in the insulating member 101 are shown in cross-hatching. Each metal member 115 may be disposed such that its outer surface is approximately in the same plane with the light emitting element mounting surface and the corresponding side surface of the supporting member 100. In the second embodiment, the part of the metal member 115 that is exposed on the light emitting element mounting surface serves as a part of the first metal pattern 206 and the part of the metal member 115 that is exposed on the side surfaces of the supporting member 200 serves as a part of the second metal pattern 208. Filling the cut-out portions 204 with the metal member allows increased thickness of the metal patterns, so that the electrical resistance of the supporting member 200 can be reduced.

The present embodiment may utilize the same configuration as in the first embodiment except as described below.

First Metal Pattern and Second Metal Pattern

In the present embodiment, the same materials used for the metal patterns of the first embodiment can be used as the material of the metal member 115 to be embedded in the cut-out portions 204.

The cut-off portions 204 and the metal members 115 can be formed by defining through and/or non-through holes in a substrate to be formed into a plurality of supporting members connected in rows and columns. A metal member may be filled in the holes, and the individual supporting members may be separated by dividing the substrate along the metal members. In this way, each of the side surfaces of the insulating member 101 and the corresponding side surfaces of the metal members 115 can be approximately on the same plane. This allows manufacture of the supporting member 200 in which the first metal members 206 are exposed at the light emitting element mounting surface of the supporting member 200 and the first and the second metal patterns are formed continuously. That is, the cut surfaces of the metal member 115 form the second metal patterns 208. A different metal material may be applied on the exposed metal member. The shape of the metal member 115 is not limited to a semi-circular column and may be a rectangular column, a triangular prism, or any other appropriate shape. That is, the cross sectional shape defining the corresponding cut-out portions is not limited to a semi-circular shape and a V-shape or other recess shape may be employed.

The respective electrodes 103 of the light emitting element 102 may be bonded to the first metal pattern 206 of the supporting member 200 through the bonding member 110, as shown in FIG. 5 and FIG. 6. The supporting member 200 of the present embodiment may have a metal member applied thereto, so that the electrical resistance can be reduced and heat dissipating property can be improved.

Also, in the same manner as in the first embodiment, absorption of light by the bonding member 110 can be reduced and the light extraction efficiency can be improved. Thus the same effects as in the first embodiment can be obtained.

Third Embodiment

Figure 7:
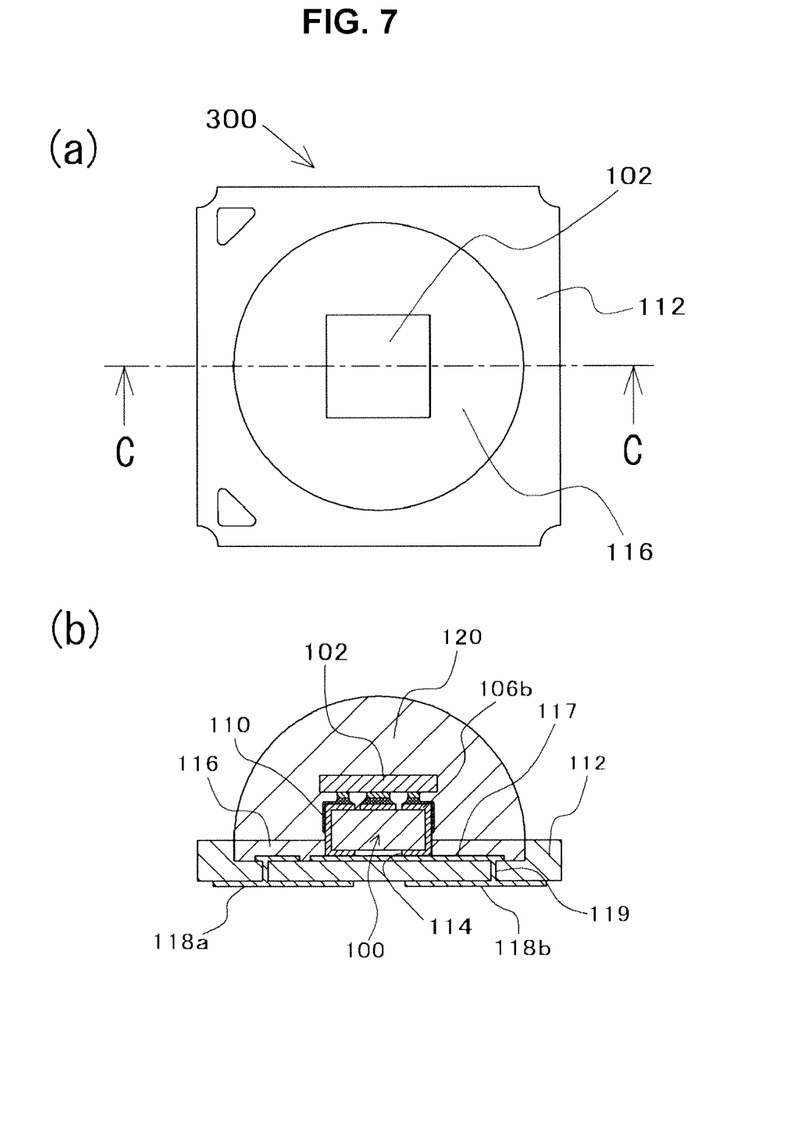
FIG. 7(a) is a top view depicting a light emitting device according to an embodiment of the present invention.
FIG. 7(b) is a front cross-sectional view depicting the light emitting device of FIG. 7(a) along the cross-section C-C, as indicated in FIG. 7(a).

As the third embodiment, a light emitting device 300 using a supporting member 100 is shown in FIGS. 7(a) and 7(b).

FIG. 7(a) is a top view depicting a light emitting device according to an embodiment of the present invention.

FIG. 7(b) is a front cross-sectional view depicting the light emitting device of FIG. 7(a) along the cross-section C-C, as indicated in FIG. 7(a).

The supporting member 100 having a light emitting element 102 mounted thereon as described in the first embodiment is mounted on the base member 112, and the covering member 120 is disposed to cover the supporting member 100 and the light emitting element 102.

Base Member

Any material capable of mounting the supporting member 100 and establishing electric connection with it can be used for the base member 112.

The same materials used in forming the insulating member 101 of the supporting member 100 can be employed in the base member 112. Examples include an insulating member such as a glass epoxy, a resin, and ceramics. A metal material having an insulating member disposed thereon may also be used. A base member 112 made of the same material as the insulating member 101 is preferable, because this will allow both the base member 112 and insulating member 101 to have the same heat dissipating coefficient, suppressing the occurrence of cracks and the like. Also, by using the same material as that in the supporting member, the base member 112 and the insulating member 101 may be formed integrally so that the insulating member 101 is included as a part of the base member 112.

The base member 112 may have a plate shape or may have a cavity. In the embodiment shown in FIGS. 7(a) and 7(b), the base member 112 has an approximately square external shape which is approximately the same in shape (though different in size) as the light emitting element 102, and has a circular cavity. The supporting member 100 may be mounted in the cavity such that the top surface of the supporting member 100 protrudes higher than the top surface of the base member.

The third metal pattern 114 may be disposed on the lower surface of the insulating member 101 and bonded to the electrically conductive pattern 117 disposed in the cavity of the base member 112. Further, the electrically conductive pattern 117 is electrically connected to the external electrodes 118a, 118b on the bottom surface of the base member 112 through the use of vias 119.

In the embodiment shown in FIG. 7(b), both of the metal patterns disposed on the bottom of the supporting member 100 may be negative terminals and electrically connected to the negative external electrodes 118b. The positive electrode of the light emitting element is connected to the external electrode 118a (not shown) through the patterns disposed on the surface of the supporting member and the surface of the base material.

A light-reflecting member 116 may be arranged to cover the conductive pattern 117 at the surface in the cavity. Thus, covering the second metal pattern 108 with the bonding member 110 allows the reflection of light propagating toward the bottom surface in the cavity without being absorbed by the bonding member, and thus improves the extraction of light.

Light Reflective Material

The light-reflecting member 116 is a member capable of efficiently reflecting light emitted from the light emitting element 102 and preferably made of an insulating material that absorbs little light and has high resistance against light and heat. Examples of suitable materials include a silicone resin, an epoxy resin, and a urea resin. In addition to these materials, a coloring agent, a light diffusing agent, a light reflecting material, various fillers, a wavelength converting material (a fluorescent material) or the like may also be included as required. When a resin material is employed, the light-reflecting member 116 can be easily formed by filling the cavity with the resin material to cover the electrically conductive pattern 117. Disposing the resin material to cover the electrically conductive pattern 117 and others such as second metal pattern 108 and the bonding member 110 enables further improvement in the light extracting efficiency. The light-reflecting member 116 may be made of an inorganic material. The electrically conductive pattern 117, the second metal pattern 108, the bonding member 110, and the like may be covered by applying a light reflective filler by way of electrodeposition coating.

According to the light emitting device of the present embodiment, practically no light from the light emitting element 102 mounted on the supporting member 100 is absorbed by the bonding member 110. Mounting on the base material 112 and covering the surface in the cavity with the light-reflecting member 116 makes it possible to obtain a light emitting device having further improved light extraction efficiency.

Appropriately adjusting the shape of the covering member 120 to be in, for example, a semicircular lens shape as shown in FIGS. 7(a) and (b), makes it possible to obtain a desired distribution of light. The covering member 120 is not specifically limited provided that it allows extraction of light emitted from the light emitting element to the outside. A light transmissive sealing member for sealing the cavity, a hollow lens or cover, or the like can be used as the covering member 120. The kind of the lens can be appropriately selected according to the desired distribution of light.

Fourth Embodiment

Figure 8:
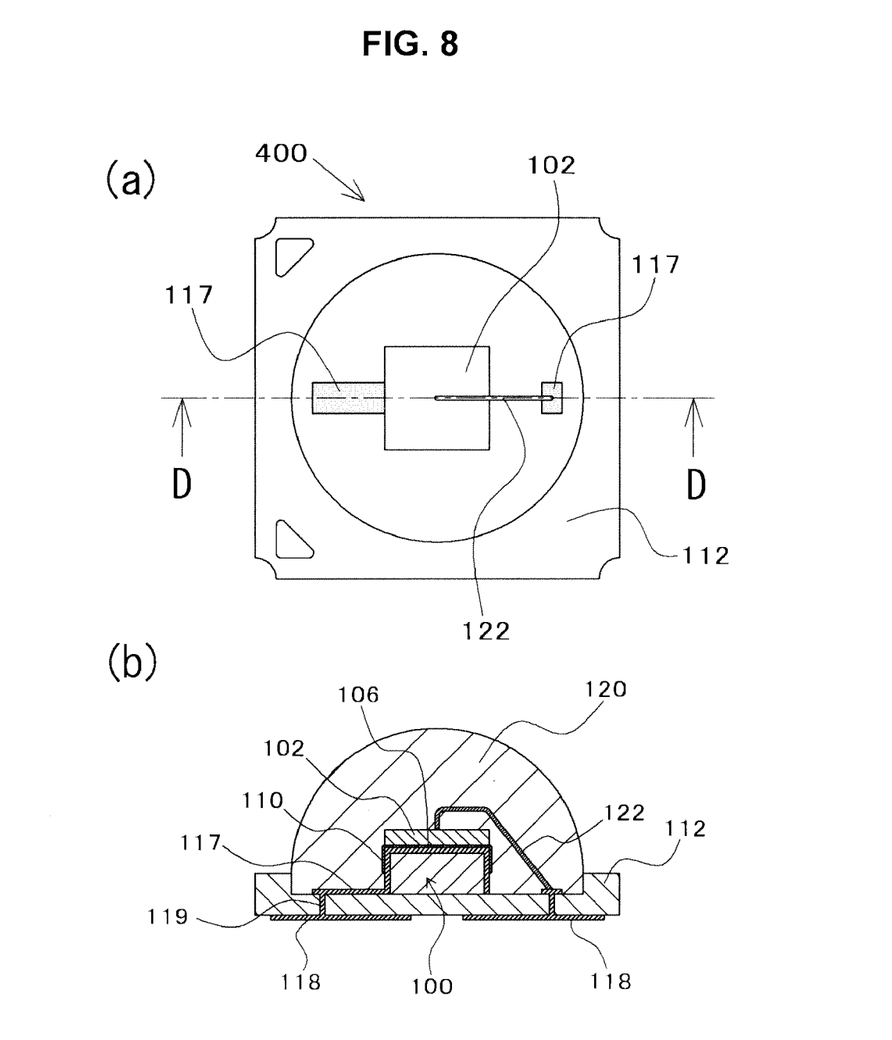
FIG. 8(a) is a top view depicting a light emitting device according to another embodiment of the present invention.
FIG. 8(b) is a front cross-sectional view depicting the light emitting device of FIG. 8(a) along the cross-section D-D, as indicated in FIG. 8(a).

As the fourth embodiment, a light emitting device 400 using a supporting member 100 is shown in FIGS. 8(a) and 8(b).

FIG. 8(a) is a top view depicting a light emitting device according to another embodiment of the present invention.

FIG. 8(b) is a front cross-sectional view depicting the light emitting device of FIG. 8(a) along the cross-section D-D, as indicated in FIG. 8(a).

The light emitting device 400 may have the same structure as that of the third embodiment except that the light emitting element 102 has a pair of electrodes arranged at the upper and lower sides thereof. The electrode disposed on the top surface and the electrically conductive pattern 117 are connected by the conductive wire 122. In the embodiment shown in FIGS. 8(a) and 8(b), the light-reflecting member is not disposed in the cavity, but the surface of the electrically conductive pattern 117 is covered with a material having high light reflectance (such as silver, gold, rhodium, or the like), and capable of exhibiting the same effects as the configuration described in the third embodiment.

Fifth Embodiment

Figure 9:
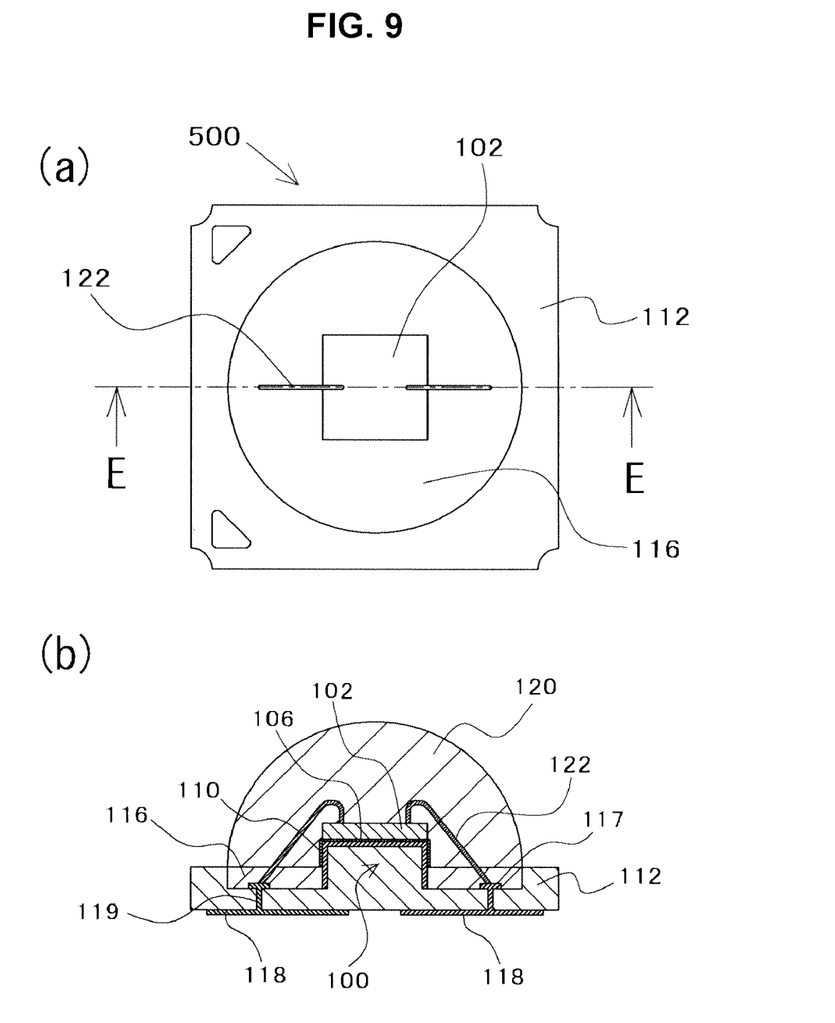
FIG. 9(a) is a top view depicting a light emitting device according to another embodiment of the present invention.
FIG. 9(b) is a front cross-sectional view depicting the light emitting device of FIG. 9(a) along the cross-section E-E, as indicated in FIG. 9(a).

As the fifth embodiment, FIGS. 9(a) and 9(b) show a light emitting device 500 using a supporting member 100.

FIG. 9(a) is a top view depicting a light emitting device according to another embodiment of the present invention.

FIG. 9(b) is a front cross-sectional view depicting the light emitting device of FIG. 9(a) along the cross-section E-E, as indicated in FIG. 9(a).

The light emitting device 500 has substantially the same structure as that is the third embodiment except that the light emitting element 102 has a pair of electrodes at the same surface side (the top side in FIGS. 9(a) and 9(b)) and is mounted on the first metal pattern of the supporting member using the insulating substrate as the mounting surface. The electrodes at the top surface of the light emitting element 102 and the electrically conductive patterns 117 of the base material are connected by the electrically conductive wires 122. The first metal pattern is formed such that it doesn't have a positive nor a negative electric potential. The light emitting device 500 of the present embodiment is also capable of exhibiting the same effects as in the third embodiment.

Sixth Embodiment

Figure 10:
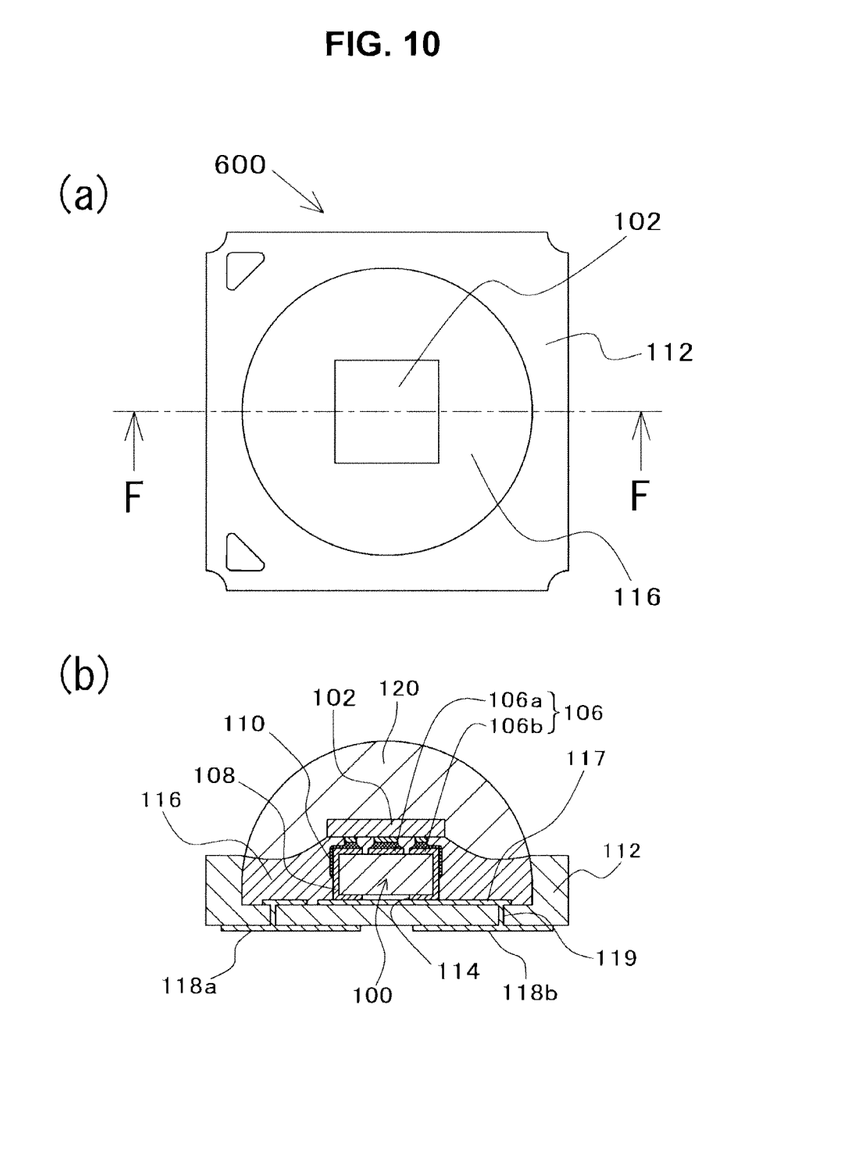
FIG. 10(a) is a top view depicting a light emitting device according to another embodiment of the present invention.
FIG. 10(b) is a front cross-sectional view depicting the light emitting device of FIG. 10(a) along the cross-section F-F, as indicated in FIG. 10(a).

As the sixth embodiment, FIGS. 10(a) and 10(b) show a light emitting device 600 using a support member 100.

FIG. 10(a) is a top view depicting a light emitting device according to another embodiment of the present invention.

FIG. 10(b) is a front cross-sectional view depicting the light emitting device of FIG. 10(a) along the cross-section F-F, as indicated in FIG. 10(a).

In this embodiment, the electrically conductive pattern 117, the second metal pattern 108, and the bonding member 110 are covered with the light-reflecting member 116. A resin material may be used for the light-reflecting member 116. Further, as shown in FIG. 10(b), the light-reflecting member 116 may be disposed such that the bottom surface of the light emitting element 102 is covered with the light-reflecting material 116. Thus, the first metal pattern 106 and the electrodes respectively bonded to the corresponding portion of the first metal pattern 106 can be covered by the light-reflecting member 116. When the light emitting element 102 is mounted on a flat surface, for example as shown in FIG. 9(b), it can be difficult to dispose the light-reflecting member such that the top of the light-reflecting member terminates at the bottom surface of the light emitting element. However, providing the supporting body 100 in the cavity defined in the base member 112, as shown in FIG. 9(b), makes it easier to cover all of the first metal pattern 106, second metal pattern 108 and bonding member 110 disposed on these metal patterns with the light-reflecting member 116. Thus, the light extraction efficiency can be further improved.

The light-reflecting member 116 can also serve as an under-fill which enables suppression of separation of light emitting element 102 due to expansion stress exerted on the covering member 120 caused by thermal shock. Further, occurrence of voids in the covering member 120 originating from beneath the light emitting element 102 can be prevented. The portions other than the portions where the light-reflecting member 116 is disposed are substantially the same as that in the third embodiment and the same effects can be obtained.

INDUSTRIAL APPLICABILITY

The supporting member according to the present invention and the light emitting device using the supporting member are capable of suppressing absorption of light by the bonding member and have excellent light extraction efficiency. The supporting members according to the present invention and the light emitting devices using the supporting devices can be utilized in applications such as various indicators, lighting apparatus, displays, backlight light sources for liquid crystal displays, and further, facsimiles, copiers, image reading systems in scanners or the like, and projector devices.

While the preferred embodiments of the devices and methods have been described in reference to the environment in which they were developed, they are merely illustrative of the principles of the inventions. Modification or combinations of the above-described assemblies, other embodiments, configurations, and methods for carrying out the invention, and variations of aspects of the invention that are obvious to those of skill in the art are intended to be within the scope of the claims.

What is claimed is:

1. A light emitting device comprising:
  a support member having a mounting surface, the support member comprising:
    an insulating member having a top surface and a plurality of side surfaces;
    a first metal pattern disposed on the top surface of the insulating member; and
    a second metal pattern disposed on at least one of the side surfaces of the insulating member such that a side surface of the second metal pattern is continuous with a top surface of the first metal pattern;
  a light emitting element mounted on the mounting surface at a location of the first metal pattern; and
  a bonding member that bonds the light emitting element to the mounting surface, wherein the bonding member covers at least a portion of the first metal pattern and at least a portion of the second metal pattern.

2. The light emitting device of claim 1, wherein the light emitting element is mounted in flip-chip configuration.

3. The light emitting device of claim 1, wherein the side surface on which the second metal pattern is disposed is substantially coplanar with a corresponding side surface of the light emitting element.

4. The light emitting device of claim 1, wherein:
  the light emitting element comprises a side surface that corresponds to the side surface on which the second metal pattern is disposed, and
  the side surface of the light emitting element extends beyond the side surface on which the second metal pattern is disposed.

5. The light emitting device of claim 1, wherein:
the supporting member comprises a cut-out section in at least one of the side surfaces, and
at least a portion of the second metal pattern is disposed in the cut-out section.

6. The light emitting device of claim 5, wherein:
the second metal pattern is made of a metal member that is embedded in the cut-out section, and
a side surface of the metal member is substantially coplanar with a corresponding side surface of the insulating member.

7. The light emitting device of claim 1, wherein:
the supporting member comprises a cut-out section in each of the side surfaces, and
at least a portion of the second metal pattern is disposed in each cut-out section.

8. The light emitting device of claim 1, wherein:
a third metal pattern is disposed on a lower surface of the supporting member, a bottom surface of the third metal pattern being continuous with the side surface of the second metal pattern.

9. The light emitting device of claim 1, further comprising:
a base member on which the support member is mounted; and
a covering member that covers at least a portion of the support member and at least a portion of the base member.

10. The light emitting device of claim 1, further comprising a light-reflecting member disposed on at least one of (i) the second metal pattern, and (ii) the bonding member.

11. The light emitting device of claim 1, further comprising:
a conductive pattern disposed on a base member; and
a light-reflecting member disposed on the conductive pattern.

12. The light emitting device of claim 1, further comprising a light-reflecting member disposed on at least a portion of the second metal pattern.

13. The light emitting device of claim 1, further comprising a light-reflecting member disposed on at least a portion of the bonding member.

14. The light emitting device of claim 1, wherein:
the first metal pattern comprises at least one first terminal and at least one second terminal,
the first terminal includes at least one concave portion, and
a portion of the at least one second terminal interposes the concave portion of the at least one first terminal.

15. The light emitting device of claim 1, wherein:
the first metal pattern comprises a first terminal and at least one second terminal, the first terminal includes a protrusion at each of a pair of opposing side surfaces of the supporting member, and
the side surface of the second metal pattern meets the top surface of the first metal pattern at the protrusion.

16. The light emitting device of claim 1, wherein:
the first metal pattern comprises a first terminal and at least one second terminal, and the at least one second terminal has a semicircular shape.

17. The light emitting device of claim 1, wherein:
the first metal pattern comprises a first terminal and at least one second terminal,
the light emitting device comprises a first electrode and a second electrode, the first electrode contacting the first terminal, and the second electrode contacting the second terminal,
the second terminal has a cross-sectional area that is larger than a cross-sectional area of the second electrode.

18. The light emitting device of claim 1, wherein:
the first metal pattern comprises at least one first terminal and at least one second terminal,
the first terminal includes two opposing concave portions,
the light emitting device comprises a first electrode and a second electrode, the first electrode contacting the first terminal, and the second electrode contacting the second terminal, and
a width of the first terminal between the concave portions is larger than a width of a corresponding portion of the first electrode 103a.

19. The light emitting device of claim 1, wherein a wettability of the first and second metal patterns is higher than the a wettability of the insulating member.

20. A method of manufacturing a light emitting device, the method comprising:
providing a support member having a mounting surface, the support member comprising:
an insulating member having a top surface and a plurality of side surfaces;
a first metal pattern disposed on the top surface of the insulating member; and
a second metal pattern disposed on at least one of the side surfaces of the insulating member such that a side surface of the second metal pattern is continuous with a top surface of the first metal pattern;
providing a light emitting element;
depositing a bonding member onto one or more of: (i) the mounting surface and (ii) the light emitting element; and
mounting the light emitting element to the support substrate at a location of the first metal pattern such that the bonding member bonds the light emitting element to the mounting surface and the bonding member covers at least a portion of the first metal pattern and at least a portion of the second metal pattern.

* * * * *